United States Patent [19]
Dell'ova et al.

[11] Patent Number: 6,072,534
[45] Date of Patent: Jun. 6, 2000

[54] DEVICE FOR THE SUBDIVISION OF THE PERIOD OF A SIGNAL INTO N QUASI-EQUAL PARTS

[75] Inventors: Francis Dell'ova, Seyssinet-Pariset; Thierry Gailliard; Benoit Marchand, both of Grenoble, all of France

[73] Assignee: SGS-Thomson Microelectronics S.A., Gentilly, France

[21] Appl. No.: 08/980,609

[22] Filed: Dec. 1, 1997

[30] Foreign Application Priority Data

Dec. 5, 1996 [FR] France ................................. 96 15179

[51] Int. Cl.7 ........................................................... H04N 9/45
[52] U.S. Cl. ..................... 348/524; 348/529; 327/115; 327/117; 327/126; 377/47; 377/50
[58] Field of Search ..................... 348/521, 524, 348/529, 547, 704; 327/114, 115, 117, 126, 141, 160, 162, 164, 175, 176, 178; 377/47, 48, 50, 94

[56] References Cited

U.S. PATENT DOCUMENTS

| | | | |
|---|---|---|---|
| 4,144,579 | 3/1979 | Nossen et al. | 327/126 |
| 4,197,509 | 4/1980 | Curran et al. | 327/126 |
| 4,658,406 | 4/1987 | Pappas | 377/48 |
| 4,959,616 | 9/1990 | Matsumoto | 327/126 |
| 4,974,082 | 11/1990 | Heitmann | 348/121 |
| 5,052,031 | 9/1991 | Molloy | 327/176 |
| 5,144,255 | 9/1992 | Malka et al. | 327/160 |
| 5,222,110 | 6/1993 | Holzinger et al. | 377/48 |
| 5,248,900 | 9/1993 | Davis | 327/160 |
| 5,267,273 | 11/1993 | Dartois | 377/48 |
| 5,305,106 | 4/1994 | Fukushima et al. | 348/521 |
| 5,416,434 | 5/1995 | Kootstra et al. | 327/164 |
| 5,572,157 | 11/1996 | Takashi et al. | 327/156 |
| 5,963,106 | 10/1999 | Blyth et al. | 327/176 |
| 6,018,258 | 1/2000 | Kang | 327/115 |

FOREIGN PATENT DOCUMENTS

| | | | |
|---|---|---|---|
| 0 280 126 | 8/1988 | European Pat. Off. | H03K 23/66 |
| 0 322 012 | 6/1989 | European Pat. Off. | H03K 4/02 |

OTHER PUBLICATIONS

IBM Technical Disclosure Bulletin, vol. 16, No. 6, (Nov. 1973), p. 1765, "Deflection Drive System".

Primary Examiner—Victor Kostak
Attorney, Agent, or Firm—Theodore E. Galanthay; Allen, Dyer, Doppelt, Milbrath & Gilchrist, P.A.

[57] ABSTRACT

The period of an input signal is subdivided into N parts by carrying out a count, during this period, of the pulses delivered by a clock. This number is divided by N and then the remainder of this division is distributed among all the N parts of the period of the input signal. This technique may be applied to the generation of scanning signals in television.

10 Claims, 3 Drawing Sheets

DEVICE FOR THE SUBDIVISION OF THE PERIOD OF A SIGNAL INTO N QUASI-EQUAL PARTS

FIELD OF THE INVENTION

The present invention relates to a device for the subdivision of the period T of a signal into N quasi-equal parts. It can be applied in all fields, especially in the field of television. In this field, it will preferably be used to produce a vertical scanning signal from a vertical synchronization signal.

BACKGROUND OF THE INVENTION

The invention shall be described, for greater facility, with reference to the processing of television signals without any limitation being thereby entailed in the scope of the invention. Among the television signals used to display images on cathode ray screens, there are the known vertical scanning signals, as well as horizontal scanning signals. These scanning signals are derived from vertical and horizontal synchronization signals. The scanning signals are applied to deflection coils of one or more guns projecting electrons from a cathode towards a light-emitting screen. To form an image, the scanning of the screen is thus prompted to form a certain number of lines stacked on one another from top to bottom.

Depending on the resolution envisaged, as well as on the display standards used in the different regions of the world, the number of lines displayed on the screen varies. Whereas, at present, there are known images with 420 lines or 625 lines, the new standards provide for 1024 lines or even 2048 lines. Furthermore, the refresh frequency of the images on the screen, which is 25 images per second, also depends on the standards and qualities sought. For example, 100 images per second are envisaged in order to avoid the effects of flicker. Multi-purpose scanning signal generators are therefore made to cope with these different standards.

These scanning signal generators have to generate saw-toothed scanning signals from synchronization signals, the period of these saw-toothed scanning signals being equal to the period of the corresponding synchronization signal, and their maximum amplitude being constant whatever this period. There are vertical synchronization signals and horizontal synchronization signals respectively associated with the vertical and horizontal scanning signals. These synchronization signals contain information elements on time related to the beginning of a line and the beginning of a frame (or half-frame). The period of these synchronization signals therefore varies as a function of the refresh frequency of the images on the screen and as a function of the number of lines displayed on the screen.

Until now, it is only analog circuits such as the TDA 9106 monitor circuit from SGS Thomson Microelectronics that fulfil this function. However, such circuits have an uncertainty of about 1% with regard to the maximum amplitude of the scanning signals at each change in frequency of the synchronization signal. Thus, for two different scanning frequencies, the maximum amplitude of the two scanning signals may be different. The implementation of such a circuit therefore requires a prior setting of the monitor according to the refresh frequency. At each change in standard, for example from VGA to SVGA, it is necessary to readjust the button for the vertical positioning of the image.

SUMMARY OF THE INVENTION

Thus, the main problem that the invention seeks to resolve is that of providing a device that guarantees a maximum constant amplitude of the scanning signals, whatever the standard used.

To overcome the drawback referred to above, it is planned to use a digital circuit to generate the scanning signals. The technique used to ensure a constant maximum amplitude includes subdividing the period of the synchronization signal into N parts and associating an amplitude value to each part to shape the scanning signal. In this way, the maximum amplitude of the scanning signal is fixed by the digital circuit and does not depend on the period of the synchronization signal. FIGS. 1A to 1D illustrate an exemplary subdivision of the period of a vertical synchronization signal VSYNC. FIGS. 1A and 1B respectively show a clock signal CK and the vertical synchronization signal VSYNC. FIG. 1C illustrates the case where the period of the signal VSYNC is subdivided into four equal parts. In this example, the period of the signal VSYNC is equivalent to 23 clock periods. Each part is therefore equivalent to 5 clock periods and the 3 remaining clock periods are juxtaposed in the last part. This technique therefore makes it possible to obtain a constant maximum amplitude whatever the period of the signal VSYNC since the period is subdivided into a fixed number of parts N and since a given value of amplitude is associated with each part. However, this subdivision is not satisfactory, for the last part to which the remaining part of the period is added is disproportionate with respect to the other parts. After the analog conversion of this signal, there is a risk of obtaining a clipped analog signal and this means that several video lines get superimposed on the screen.

Thus, the solution includes distributing the remaining clock pulses among all the parts of the period of the signal VSYNC. This approach is described in FIG. 1D. The period of the synchronization signal VSYNC is then subdivided into N quasi-equal parts. It must be noted that, in practice, the period of a vertical synchronization signal will be subdivided into a very large number of parts, 4096 for example. Some of these parts will be devoted to the frame flyback but this is not the object of the present invention.

In the invention, it is sought to be able to subdivide the period of any signal into N quasi-equal parts. This aim is achieved in the invention by carrying out a count, during a chosen period of the synchronization signal, of the pulses delivered by a clock that is fast enough to produce many pulses during this period. After this count, during a first period having a given duration, there is obtained a number A of pulses related to the frequency of this clock and to the duration of this period. Then, this number of pulses is divided by the number N to obtain a number B and a number R of pulses corresponding respectively to the quotient and to the remainder of the division of A by N. These steps constitute the acquisition phase of the numbers of pulses B and R. Then, the number R of remaining pulses is distributed in the N blocks of pulses at the rate of a maximum of one pulse per block. Then a counter is precharged sometimes with the number B and sometimes with the number B+1, and the pulses produced by the clock are counted out. Whenever a block of B or B+1 pulses is counted, an end-of-block signal is delivered and the counter is precharged again with a new value.

An object of the invention therefore is a device for the subdivision of the period T of an input signal into N blocks that are quasi-equal in terms of number of clock pulses. The device preferably comprises: a clock delivering a number A of pulses during the period T of the input signal, A being smaller than or equal to $2^{P+M}$, with P and M as integers; a first M-bit register to store a number R of pulses equal to the remainder of the division of the number A of pulses by the number N, with N equal to $2^M$; a second P-bit register to store a number B of pulses equal to the quotient of the division of the number A of pulses by the number N; means of distribution for the inclusion, at each period T, at a rate of one pulse per block, of R pulses in R blocks taken randomly from among the N pulse blocks of the period T; a binary digital counter with P bits whose pre-loading input is connected to the output of the distribution means delivering the blocks and whose counting input receives the clock pulses, the counter producing an end-of-block signal. The distribution means preferably comprises: a) an accumulator activated by the end-of-block signal of the counter to produce a number equal to one or zero at output, at a rate of R numbers equal to one on a set of N numbers, the number R being given to the accumulator by the first register; and b) an adder to add the number equal to one or zero produced by the accumulator to the number B contained in the second register and to give the sum number to the binary digital counter.

According to the invention, quasi-equal blocks of pulses are thus produced, these blocks comprising B or B+1 clock pulses. In a preferred embodiment, the accumulator comprises: an adder receiving the number R stored in the first register at a first input, a number $S_{i-1}$ at a second input and delivering the result $S_i$ of the addition of the number R with the number $S_{i-1}$ at a first output, and a number indicating the capacity overflow of the adder at a second output, the second output being connected to the output of the accumulator; and a register comprising a data input connected to the first output of the adder, an activation input receiving the end-of-block signal from the counter, a clock input receiving the clock pulses and a data output connected to the second input of the adder giving the number $S_{i-1}$.

According to another embodiment of the device, the accumulator comprises a generator of random numbers connected to a pre-loading input of the register of the accumulator for the loading, into the register, of a different number at each period T of the input signal. The fact of pre-loading a different number at the beginning of each period T into the register of the accumulator will avert the effects of persistence on a television screen, i.e. as far as possible, it will avert a situation where, for two successive periods, blocks of the same rank comprises B+1 pulses.

To generate a saw-toothed scanning signal, the subdivision device may further comprise an additional binary digital counter to associate a specific number with each block of pulses of a period T corresponding to the rank of this block in the period T. This additional counter receives the end-of-block signals at its counting input and delivers, at a data output, the number associated with each block of pulses.

BRIEF DESCRIPTION OF THE DRAWINGS

Other features and advantages of the invention shall appear from the following detailed description, made with reference to the appended drawings, of which.

DETAILED DESCRIPTION OF THE PREFERRED EMBODIMENTS

To subdivide the input signal, which herein is the vertical synchronization signal VSYNC, into N quasi-equal parts, it is necessary first of all to measure the period of this signal and then divide this period into N equal parts and divide the remainder of the period into N equal parts. In the exemplary application more particularly described herein (pertaining to the generation of a vertical scanning signal), the number N of blocks is preferably chosen to be greater than the number of lines that the television monitor is likely to show. In view of the fact that, to increase the resolution of the images, this number is constantly increasing, the value that has been chosen is N=4096. Furthermore, N is chosen to be equal to a power of 2 so that the division by N is done in a very simple way.

Figure 2:
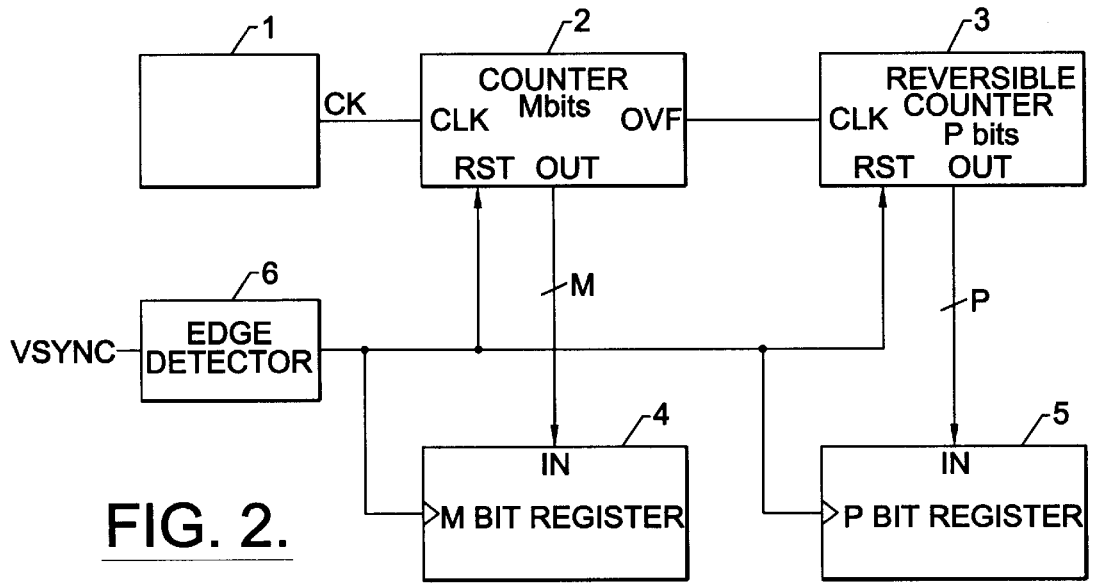
FIG. 2 is a circuit enabling the acquisition of the numbers B and R.

FIG. 2 shows a circuit that can be used to measure the period of the input period VSYNC and divide it by N in order to obtain the size of the N equal parts as well as that of the remainder of the period. This circuit therefore carries out the acquisition of the numbers B and R. This circuit has a clock 1 delivering a large number A of pulses during a chosen period of the signal VSYNC. It is therefore possible, for example, to choose a clock 1 oscillating at 24 MHZ. If the period of the signal VSYNC is 20 milliseconds (25 images per second), A is then equal to 480,000.

The circuit furthermore comprises a first counter 2 of M bits whose carry output OVF is connected to the counting input CLK of a second P-bit counter 3. M is defined by the relationship $N=2^M$. The counter 2 receives, at its counting input, the clock signal CK coming from the clock 1 and whenever its most significant bit goes back to zero, it prompts the counting of one unit in the counter 3. If the counting is watched for a chosen period of the signal VSYNC, it is observed that, at the end of the counting operation, the counter 3 is loaded with a number equal to the number of times that the counter 2 has made turns.

In the exemplary application referred to herein, the vertical synchronization signal VSYNC is subdivided into 4096 parts. The counter 2 is therefore a 12-bit counter ($4096=2^{12}$). At the end of the counting operation, the counter 3 is then loaded with a number equal to the number of times that the counter 2 has counted up to 4096. If the period of the signal VSYNC is 20 milliseconds and if the clock frequency is 24 MHZ, the counter 2, at the end of the counting operation, contains the value 768 corresponding to the number of pulses R remaining after the division of A by N and the counter 3 contains the value 117 corresponding to number B representing the quotient of the division of A by N. The counter 3 therefore, at the end of the counting operation, stores the number B of pulses contained in the blocks of pulses before the distribution of the number R among these same blocks.

To limit the counting to only one period, the counters 2 and 3 are reset whenever an edge detector 6 detects a trailing edge in the synchronization signal VSYNC. Furthermore, the state of the counters 2 and 3 is saved in registers, respectively 4 and 5, before the resetting of the counters.

Figure 3:
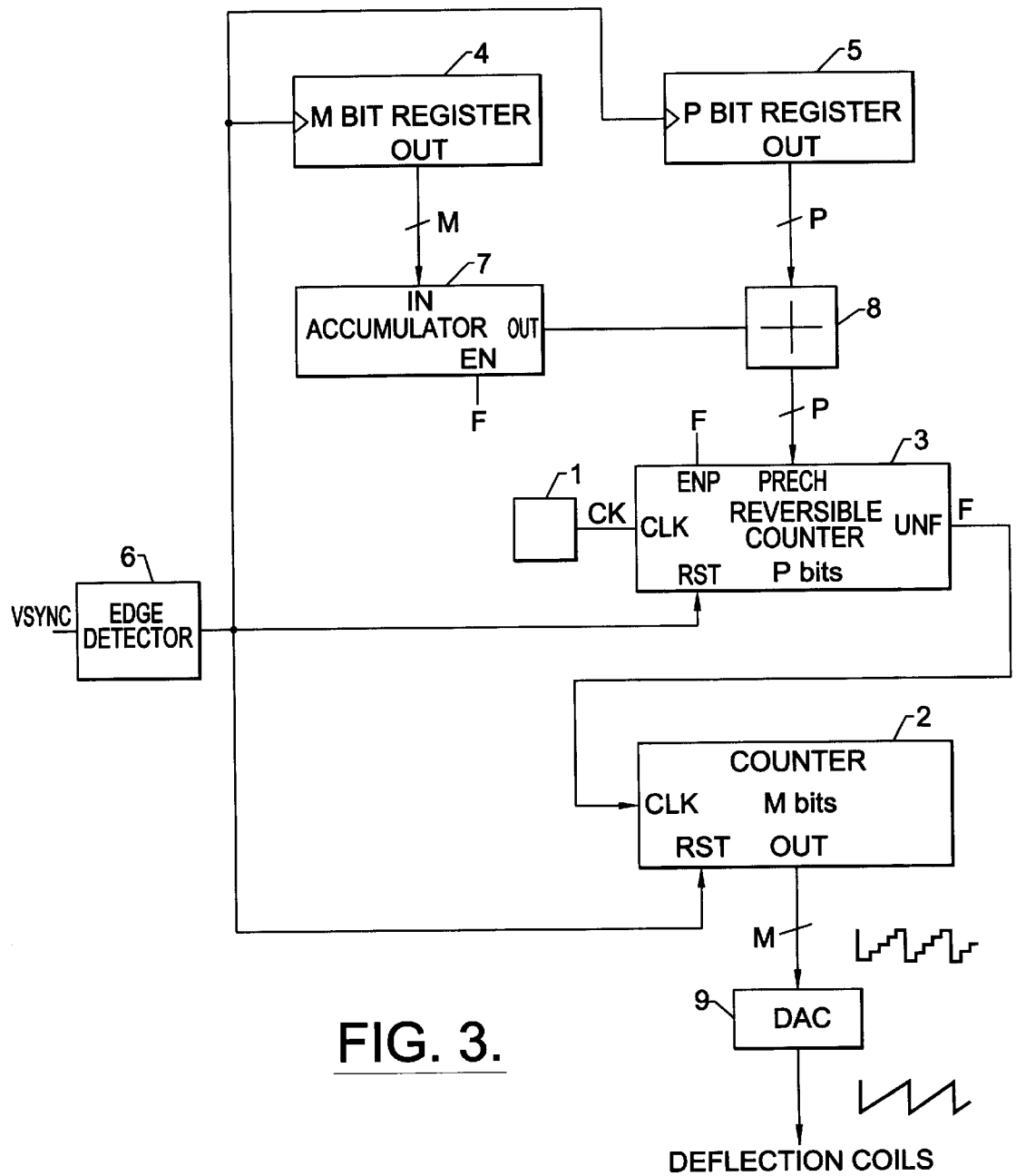
FIG. 3 is a generator of vertical scanning signals comprising the subdivision device of the invention.

FIG. 3 shows a device for the subdivision of the period T of the signal VSYNC into N quasi-equal parts according to the invention. This device in particular takes up the elements of FIG. 2 but these elements are at present organized differently. In practice, we are referring to a microprocessor-based system. The reorganization of the connections is therefore fairly simple.

At its counting input, the counter 3 now receives the pulses CK coming from the clock 1. This counter actually is a reverse counter that is pre-loaded before the reverse counting operation by a sum value coming from an adder 8. This sum value corresponds to the size of a block of pulses after distribution of the number R and may be equal to either B or to B+1. Indeed, the adder 8 is given the task of adding the contents of the register 5 with a value 1 or 0 present at output of an accumulator 7. The accumulator 7 receives the contents of the register 4 at input. The mean constituted by the adder 8 and the accumulator 7 enable the distribution, at the rate of one pulse per block, of R pulses in R blocks taken randomly from among the N blocks of pulses of the period of the signal VSYNC. The structure of the accumulator 7 shall be described in FIG. 4.

Once the counter 3 is pre-loaded, it carries out a reverse count of its contents, at the rate of the pulses of the clock 1, until the state zero is reached. When this state is reached, it delivers an end-of-block pulse F at an underflow output UNF. In other words, at each of a block, the counter 3 delivers an end-of-block signal F. This end-of-block signal F is applied firstly to an input EN for putting the accumulator 7 into operation so that this accumulator delivers a value 1 or 0 at its output OUT and secondly to an input ENP for authorizing the pre-loading of the counter 3 to authorize the pre-loading of the counter 3 with the sum value presented at output of the adder 8.

Figure 1A:
FIGS. 1A to 1D, already described, show timing diagrams illustrating the subdivision of the period of a vertical synchronization signal into four quasi-equal parts.
Figure 1B:
Figure 1C:
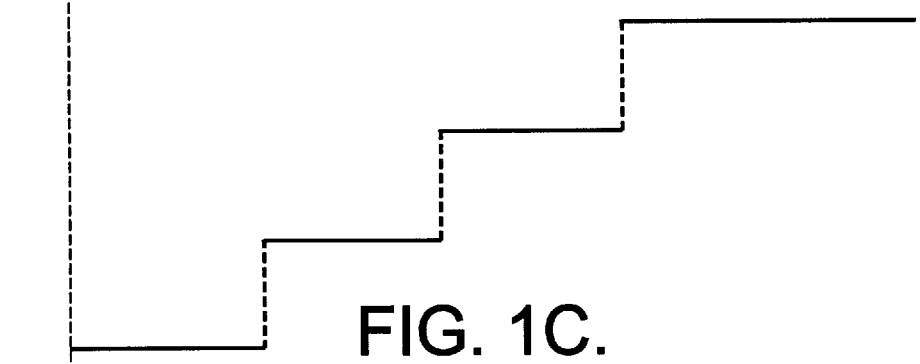
Figure 1D:
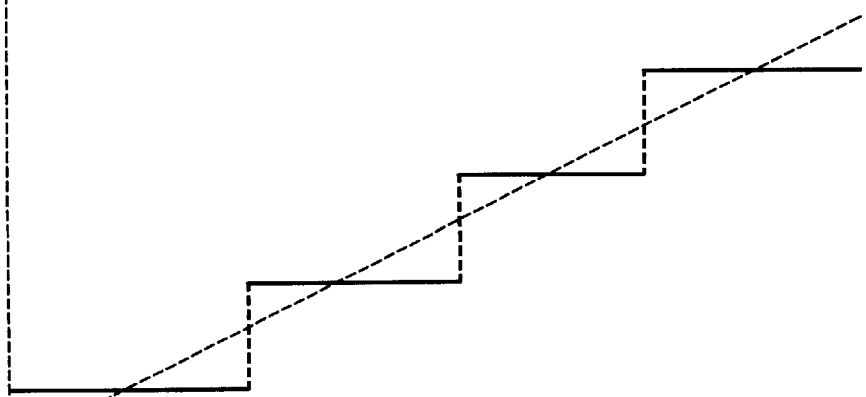

This end-of-block signal is also applied to the counting input CLK of the counter 2 which is an M-bit counter. The counter 2 then delivers a number of M bits for each block corresponding to the rank of this block in the period of the signal VSYNC. All the numbers or binary words obtained at the output of the counter 2 then constitute a saw-toothed binary signal such as the one shown in FIG. 1D. This binary signal, to be capable of being used by the deflection coils of a television monitor or receiver, is then converted by a digital/analog converter 9 and then applied to the vertical deflection coils of the monitor.

Figure 4:
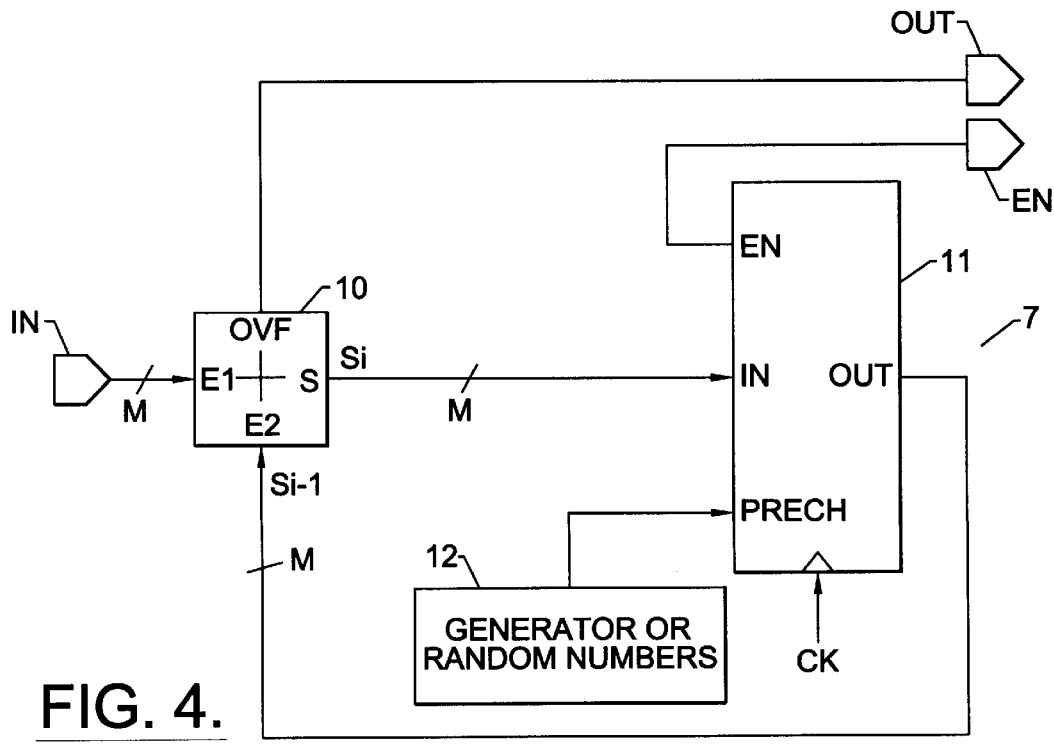
FIG. 4 is a diagram of an accumulator according to the invention.

In this device, the accumulator 7 must be capable of delivering R values equal to 1 on a set of N values. FIG. 4 describes a possible structure of the accumulator 7. The accumulator 7 has a data input IN, an activation input EN and an output OUT. At the input IN, it receives the number R of pulses contained in the register 4 and the input EN is connected to the output UNF of the counter 3. It includes an adder 10 comprising two data inputs E1 and E2 on M bits, a data output S and a carry output OVF. The data output S is connected to the input IN of an M-bit register 11 and the output OUT of the register 11 is connected to the input 32 of the adder 10. The input E1 of the adder 11 is connected to the input IN of the accumulator 7 and its output OVF is connected to the output OUT of the accumulator. Finally, the activation input EN of the accumulator 7 is connected to the activation terminal EN of the register 11. Thus connected, the register 11 stores the value present at output of the adder 10 whenever the counter 3 sends out an end-of-block signal F.

To explain the working of the accumulator 7, $S_i$ designates the value obtained at output of the adder 10. Each iteration i is triggered by an end-of-block signal F. The adder 10 performs the following function:

(1) $S_i = (R + S_{i-1}) \mod N$ with $i \in [1, N]$ et $R \in [0, N-1]$

The equation (1) then means that:

(2) $\exists O_i \in \{0,1\} / R + S_{i-1} = O_{i-1} * N + S_i$

Indeed, by definition $S_i \in [0, N-1]$ and $R \in [0, N-1]$. In the equation (2), $O_i$ represents the carry value of the adder 10 at each iteration.

Hereinafter, it will be shown that:

$$\sum_{i=0}^{N-1} O_i = R$$

From the equation (2), by summing the N recurrent equations, it can be deduced that:

$$N * R + S_0 = N * \sum_{i=0}^{N-1} O_i + S_N$$

giving:

$$\sum_{i=0}^{N-1} O_i = R * \frac{S_0 + S_N}{N} \quad (3)$$

Besides, the following property is known:
Let X, Y and Z be natural integers, then $[X+(Y \mod Z)] \mod Z = (X+Y) \mod Z$ If this property is applied N times to the equation (1), then $S_N = (N*R+S_0) \mod N$ is obtained. This equation can be simplified into $S_N = S_0 \mod N = S_0$.

From the equation (3), we then obtain $$\sum_{i=0}^{N-1} O_i = R$$

This demonstration shows that, on a total of N iterations, the carry value $O_i$ will be R times equal to 1. The carry value $O_i$ is therefore added methodically to the number B to pre-load the counter 3. Thus, over a period of the signal VSYNC, the counter 3 will be pre-loaded R times by the number B+1 and N−R times by the number B.

According to a preferred embodiment, the accumulator 7 has a random number generator 12. The output of this generator is connected to the pre-loading input of the register 11. This generator will enable the loading of a different number in the register 11 at each new period of the synchronization signal VSYNC and thus eliminate the effects of persistence on the screen that could be caused by the fact that, for two successive periods, two blocks of the same rank comprise B+1 pulses.

In practice, this generator of random numbers 11 may be a generator delivering sequences of random numbers based on a maximum sequence polynomial. The degree of this polynomial will be chosen as a function of the length of the desired sequence. The length of this sequence will be preferably equal to the number N of blocks of pulses. A sequence of greater length will be unnecessary. For example, to obtain a sequence of 1023 pseudo-random values, the following 10th degree polynomial will be used: $P(x)=1+x^3+x^{10}$. The implementation of a polynomial such as this is well known to those skilled in the art.

That which is claimed is:

1. A device for the subdivision of the period T of an input signal into N blocks that are quasi-equal in terms of a number of clock pulses, said device comprising:

a clock delivering a number A of pulses during the period T of the input signal, A being smaller than or equal to $2^{P+M}$, with P and M as integers;

a first M-bit register to store a number R of pulses equal to the remainder of the division of the number A of pulses by the number N, with N equal to $2^M$;

a second P-bit register to store a number B of pulses equal to the quotient of the division of the number A of pulses by the number N;

means of distribution for the inclusion, at each period T, at a rate of one pulse per block, of R pulses in R blocks taken randomly from among said N pulse blocks of said period T; and a binary digital counter with P bits comprising a pre-loading input connected to the output of said distribution means, and a counting input receiving the clock pulses, said counter producing an end-of-block signal; said distribution means comprising:
  a) an accumulator activated by the end-of-block signal of said counter to produce a number equal to one or zero at output, at a rate of R numbers equal to one on a set of N numbers, the number R being given to said accumulator by the first register; and
  b) an adder to add the number equal to one or zero produced by the accumulator to the number B contained in the second register and to give the sum number to said binary digital counter.

2. A subdivision device according to claim 1, wherein the accumulator comprises:

an adder receiving the number R stored in the first register at a first input, a number $S_{i-1}$ at a second input and delivering the result $S_i$ of the addition of the number R with the number $S_{i-1}$ at a first output, and a number indicating the capacity overflow of the adder at a second output, said second output being connected to the output of the accumulator; and a register comprising a data input connected to the first output of the adder, an activation input receiving the end-of-block signal from said counter, a clock input receiving the clock pulses and a data output connected to the second input of the adder giving said number $S_{i-1}$.

3. A subdivision device according to claim 2, wherein the accumulator comprises a generator of random numbers connected to a pre-loading input of the register of the accumulator for the loading, into said register, of a different number at each period T of the input signal.

4. A subdivision device according to claim 2, further comprising an additional binary digital counter to associate a specific number with each block of pulses of a period T corresponding to the rank of this block in said period T, said additional counter receiving the end-of-block signals at its counting input and delivering, at a data output, the number associated with each block of pulses.

5. A television circuit comprising:

a generator of vertical scanning signals comprising a subdivision device for the subdivision of the period T of an input signal into N blocks that are quasi-equal in terms of a number of clock pulses, said subdivision device comprising:

a clock delivering a number A of pulses during the period T of the input signal, A being smaller than or equal to $2^{P+M}$, with P and M as integers;

a first M-bit register to store a number R of pulses equal to the remainder of the division of the number A of pulses by the number N, with N equal to $2^M$;

a second P-bit register to store a number B of pulses equal to the quotient of the division of the number A of pulses by the number N;

means of distribution for the inclusion, at each period T, at a rate of one pulse per block, of R pulses in R blocks taken randomly from among said N pulse blocks of said period T; and a binary digital counter with P bits comprising a pre-loading input connected to the output of said distribution means, and a counting input receiving the clock pulses, said counter producing an end-of-block signal, said distribution means comprising:
  a) an accumulator activated by the end-of-block signal of said counter to produce a number equal to one or zero at output, at a rate of R numbers equal to one on a set of N numbers, the number R being given to said accumulator by the first register; and
  b) an adder to add the number equal to one or zero produced by the accumulator to the number B contained in the second register and to give the sum number to said binary digital counter.

6. A television circuit according to claim 5, wherein the accumulator comprises:

an adder receiving the number R stored in the first register at a first input, a number $S_{i-1}$ at a second input and delivering the result $S_i$ of the addition of the number R with the number $S_{i-1}$ at a first output, and a number indicating the capacity overflow of the adder at a second output, said second output being connected to the output of the accumulator; and a register comprising a data input connected to the first output of the adder, an activation input receiving the end-of-block signal from said counter, a clock input receiving the clock pulses and a data output connected to the second input of the adder giving said number $S_{i-1}$.

7. A television circuit according to claim 6, wherein the accumulator comprises a generator of random numbers connected to a pre-loading input of the register of the accumulator for the loading, into said register, of a different number at each period T of the input signal.

8. A television circuit according to claim 6, further comprising an additional binary digital counter to associate a specific number with each block of pulses of a period T corresponding to the rank of this block in said period T, said additional counter receiving the end-of-block signals at its counting input and delivering, at a data output, the number associated with each block of pulses.

9. A method for the subdivision of the period T of an input signal into N blocks that are quasi-equal in terms of a number of clock pulses, the method comprising the steps of:

delivering a number A of pulses during the period T of the input signal, A being smaller than or equal to $2^{P+M}$, with P and M as integers;

storing in a first register a number R of pulses equal to the remainder of the division of the number A of pulses by the number N, with N equal to $2^M$;

storing in a second register a number B of pulses equal to the quotient of the division of the number A of pulses by the number N;

including, at each period T, at a rate of one pulse per block, of R pulses in R blocks taken randomly from among said N pulse blocks of said period T; and providing a binary digital counter with P bits comprising a pre-loading input connected to receive the R pulses in R blocks, and a counting input receiving the clock pulses, said counter producing an end-of-block signal, wherein the step of including comprises a) activating an accumulator by the end-of-block signal of said counter to produce a number equal to one or zero at output, at a rate of R numbers equal to one on a set of N numbers, the number R being given to said accumulator by the first register; and b) adding the number equal to one or zero produced by the accumulator to the number B contained in the second register and to give the sum number to said binary digital counter.

10. A method according to claim 9 further comprising the step of using the subdivision steps for generating vertical scanning signals in a television receiver.

* * * * *